(12) United States Patent
Kim

(10) Patent No.: US 7,488,637 B2
(45) Date of Patent: Feb. 10, 2009

(54) CMOS IMAGE SENSOR AND METHOD FOR FORMING THE SAME

(75) Inventor: Jong-Chae Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 330 days.

(21) Appl. No.: 11/280,694

(22) Filed: Nov. 16, 2005

(65) Prior Publication Data

US 2006/0121640 A1 Jun. 8, 2006

(30) Foreign Application Priority Data

Dec. 7, 2004 (KR) .................. 10-2004-0102544

(51) Int. Cl.
*H01L 21/8238* (2006.01)

(52) U.S. Cl. .......... 438/201; 438/257; 438/587; 438/593; 438/631; 438/655; 438/669; 438/682; 257/239; 257/261; 257/315; 257/377; 257/382; 257/388; 257/413; 257/755

(58) Field of Classification Search ........... 438/200, 438/210, 237, 275, 382, 585, 587, 631, 669, 438/682, FOR. 187, 201, 211, 257, 593, 630, 438/649, 655, 664, FOR. 203, FOR. 338, 438/FOR. 360; 257/239, 261, 314, 315, 257/377, 382, 384, 388, 413, 755, E29.161, 257/E29.129, E29.3, E21.179, E21.422, E21.68
See application file for complete search history.

(56) References Cited

U.S. PATENT DOCUMENTS

2003/0234432 A1* 12/2003 Song et al. ............. 257/440
2004/0026724 A1  2/2004 He et al.
2004/0036008 A1  2/2004 Barna
2005/0062084 A1* 3/2005 Han ....................... 257/292
2005/0067639 A1* 3/2005 Jeon et al. .............. 257/291

FOREIGN PATENT DOCUMENTS

JP 2002-280538 9/2002
KR 2003-53158 A 6/2003
KR 1020030097648 12/2003

* cited by examiner

*Primary Examiner*—N Drew Richards
*Assistant Examiner*—Joannie A Garcia
(74) *Attorney, Agent, or Firm*—F. Chau & Assoc., LLC

(57) ABSTRACT

A CMOS image sensor and a method for forming the same are provided. According to the method, a gate insulating layer and a doped polysilicon layer which are sequentially stacked on a substrate are patterned to form a transfer gate and a reset gate set apart from each other. A floating diffusion layer between the transfer gate and the reset gate, a light receiving element at a side of the transfer gate away from and opposite to the floating diffusion layer and a source/drain region at a side of the reset gate away from and opposite to the floating diffusion layer are formed. An insulation layer and a mold layer are sequentially formed on an entire surface of the substrate, and the mold layer is planarized until the insulation layer is exposed. The exposed insulation layer is removed to further expose an upper surface of the gates. A selective silicidation process is carried out using a metal gate layer to form a metal gate silicide on the exposed gate. The sequential steps in the selective silicidation process alleviate the metal contamination prevalent in various wet cleaning processes that may increase the malfunction of CMOS image sensors.

24 Claims, 15 Drawing Sheets

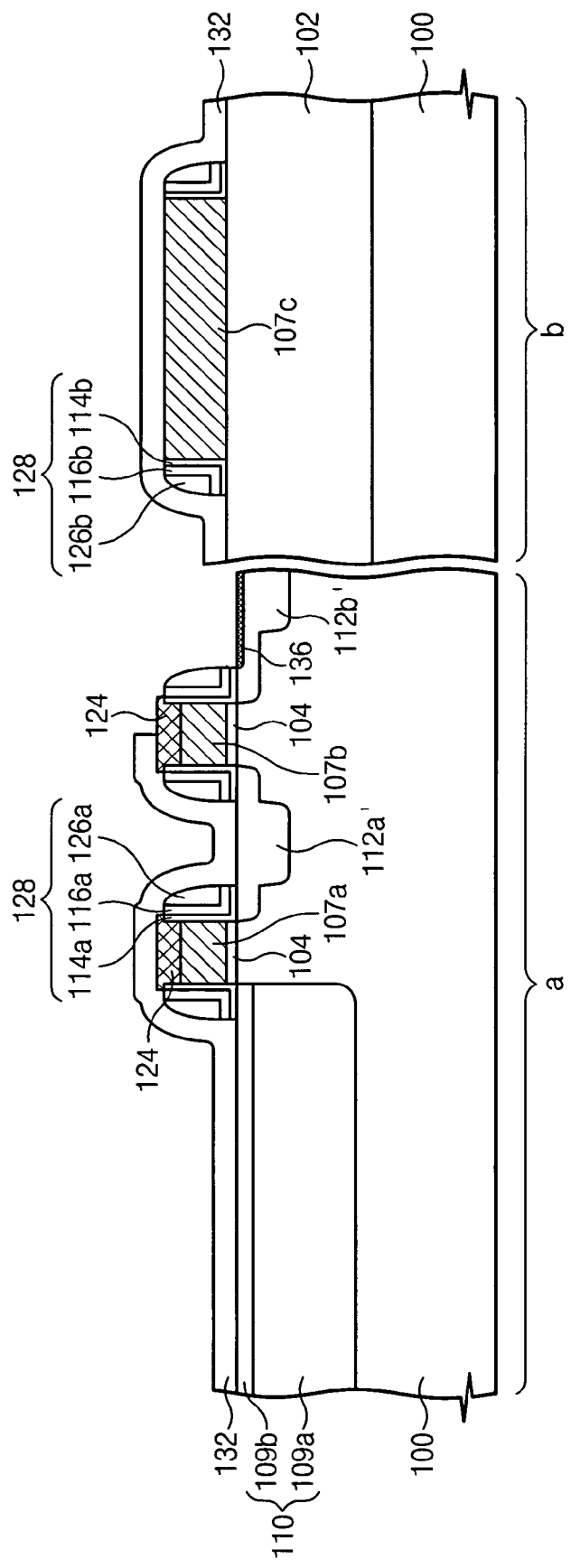

CMOS IMAGE SENSOR AND METHOD FOR FORMING THE SAME

CROSS-REFERENCE TO RELATED APPLICATIONS

This U.S. non-provisional patent application claims priority under 35 U.S.C. § 119 to Korean Patent Application 2004-102544 filed on Dec. 7, 2004, the entire contents of which are incorporated by reference herein.

BACKGROUND OF THE INVENTION

The present invention relates to a semiconductor device and a method for forming the same, more particularly, to a complementary-metal-oxide-silicon CMOS image sensor and a method for forming the same.

The CMOS image sensor is a device transforming an optical image into an electric signal. The CMOS image sensor has lower power consumption than the currently known charge coupled device CCD image sensor. In addition, the CMOS image sensor is advantageous for its high integration and simple driving method. Numerous research studies on CMOS image sensors have been prompted by the recent trends that require the rapid development of a CMOS manufacturing process of a semiconductor device.

In general, a pixel of a CMOS image sensor is divided into a light receiving unit and a CMOS unit for controlling signal charges accumulated in the light receiving unit. The light receiving unit may consist of photodiodes, and the CMOS unit may include some MOS transistors.

Concurrent with the high integration of a semiconductor device is the requirement for a CMOS image sensor to be operational at a high speed. In order to improve the operational speed of the CMOS image sensor, a method is used to reduce the resistance of a gate included in a MOS transistor. The gate may include tungsten silicide with a low resistivity in order to reduce the resistance of the gate. The technology that includes tungsten silicide in a gate of a MOS transistor in a pixel is disclosed in the Korean Laid-open Patent Publication No. 2000-41451. The method for forming a MOS transistor, as disclosed in the Korean Laid-open Patent Publication No. 2000-41451, is described next, with reference to the accompanying simplified drawings.

FIGS. 1 and 2 are cross-sectional views illustrating a method for forming a conventional CMOS image sensor.

Referring to FIGS. 1 and 2, a gate oxide layer 2 is formed on a substrate 1, and a polysilicon layer 3 and a tungsten silicide layer 4 are sequentially formed on the gate oxide layer 2.

The tungsten silicide layer 4, the polysilicon layer 3 and the gate oxide layer 2 are patterned in series to form a gate electrode of a transfer transistor. The gate electrode includes a polysilicon pattern 3a and a tungsten silicide pattern 4a, which are sequentially stacked.

Impurity ions are selectively injected into the substrate 1 at one side of the gate electrode to form a photodiode 5. Impurity ions are selectively injected into the other side of the gate electrode to form an impurity doping layer 6. Even if not shown in FIGS. 1 and 2, a spacer is formed at the sidewalls of the gate electrode.

The tungsten silicide pattern 4a has a lower resistivity than the polysilicon pattern 3a. In turn, the resistance of the gate electrode is reduced by the tungsten silicide pattern 4a, which results to an improved operational speed of a CMOS image sensor.

However, when various kinds of wet cleaning processes are performed on the substrate 1, both after the tungsten silicide pattern 4a is formed and before the spacer is formed, the sidewalls of the tungsten silicide pattern 4a are exposed. Consequently, the photodiode 5 may be contaminated at the exposed portions of the tungsten silicide pattern 4a. The photodiode 5 may increase dark signals due to the metallic contamination. A dark signal can be described as a leakage current due to signal charges generated from the photodiode 5 when an external light is shielded. Accordingly, as the dark signal is increased, the CMOS image sensor may transmit an erroneous image signal; or, alternately, the CMOS may transmit a distorted image signal when impinged by an external light.

SUMMARY OF THE INVENTION

The embodiments of the present invention present a CMOS image sensor capable of minimizing dark signal effects, a CMOS operated at a high speed and a method of producing a CMOS, thereof.

Preferred embodiments of the present invention provide a CMOS image sensor having an optimized characteristic and a method thereof.

In an embodiment of the invention, a method for forming a CMOS image sensor is provided and may further include the following steps. The method for forming a CMOS image sensor comprising: patterning a gate insulating layer and a doped polysilicon layer sequentially stacked on a substrate to form a transfer gate and a reset gate, which are set apart from each other; forming a floating diffusion layer between the transfer gate and the reset gate; forming a light receiving element at a side of the transfer gate away from and opposite to the floating diffusion layer, and forming a source/drain region at a side of the reset gate away from and opposite to the floating diffusion layer; sequentially forming a protective insulation layer and a mold layer on an entire surface of the substrate; planarizing the mold layer until the protective insulation layer is exposed; removing the exposed protective insulation layer to expose upper surfaces of the gates; and carrying out a selective silicidation process using a metal gate layer to form metal gate silicide on the exposed gate. Further, the protective insulation layer has an etch selectivity with respect to the mold layer.

In another embodiment of the invention, the method preferably comprises: removing the planarized mold layer; forming a gate spacer at least at a sidewall of the transfer gate adjacent to the floating diffusion layer and at both sidewalls of the reset gate, to expose the floating diffusion layer and the source/drain region; forming a silicide prevention pattern covering the light receiving element and the floating diffusion layer; and carrying out a selective silicidation process using a source/drain metal layer to form metal silicide source/drain on a surface of the exposed source/drain region. The removal of the planarized mold layer may be done before the metal gate silicide is formed. These sequential steps differ from the more common removal of the planarized mold layer after the metal gate silicide is formed. Also, the metal gate silicide and the source/drain metal silicide may be formed of different metals.

A method for forming a CMOS image sensor in accordance with another embodiment of the present invention may also comprise: sequentially forming a gate insulating layer and an undoped polysilicon layer on a substrate having a resistor region and a pixel region; forming the first and the second doped polysilicon layers from the undoped polysilicon layer at the pixel region and the undoped polysilicon layer at the resistor region, respectively; patterning the first and the second doped polysilicon layer to form a transfer gate and a reset gate apart from each other at the pixel region and a resistor device at the resistor region; forming a floating diffusion layer between the transfer gate and the reset gate, a light receiving element at a sidewall of the transfer gate away from and opposite to the floating diffusion layer, and a source/drain region at a side of the reset gate away from and opposite to the floating diffusion layer; sequentially forming a buffer oxide layer, a protective insulation layer and a mold layer on an entire surface of the substrate; planarizing the mold layer until the protective insulation layer is exposed; removing the exposed protective insulation layer and the buffer oxide layer at the pixel region, in series or selectively, to expose the upper surfaces of the gates and to leave exposed the protective insulation layer on the resistor device; and carrying out a selective silicidation process using a metal gate layer to form metal gate silicide on the exposed gate. Further, through this method the protective insulation layer has an etch rate with respect to the mold layer.

In an embodiment of the invention a CMOS image sensor with optimum characteristics is provided. The CMOS image sensor comprises: a transfer gate and a reset gate, which are situated apart from each other on a substrate, where said substrate is made of doped polysilicon; a gate insulating layer interposed between the gates and the substrate; a floating diffusion layer formed between the transfer gate and the reset gate; a light receiving element placed at a sidewall of the transfer gate away from and opposite to the floating diffusion layer; a source/drain region situated at a sidewall of the reset gate away from and opposite to the floating diffusion layer; a metal gate silicide formed at an entire upper surface of the gates and formed with a selective silicidation process using a metal gate layer; a silicide prevention pattern covering the light receiving element and the floating diffusion layer; and source/drain metal silicide formed on a surface of the source/drain region and formed with a selective silicidation process using a source/drain metal layer.

In an embodiment of the invention, the metal gate silicide and the source/drain metal silicide may be formed of different metals.

In another embodiment of the invention, the CMOS image sensor further comprises: a gate spacer formed at both sidewalls of the transfer gate and at both sidewalls of the gate sidewall.

In another embodiment of the invention, the CMOS image sensor may further comprises: a gate spacer formed at the first sidewall of the transfer gate adjacent to the floating diffusion layer and at both sidewalls of the reset gate; and a protection insulation pattern and a spacer insulation pattern, which are sequentially stacked to cover the light receiving element and the second sidewall of the transfer gate adjacent to the light receiving element. The gate spacer may include any material, but preferably, includes a portion formed of the same material as the protective insulation pattern and a portion formed of any material, but most preferably the same material as the spacer insulation pattern. In this embodiment of the invention, the CMOS image sensor further comprises: a buffer oxide pattern interposed between the protection insulation pattern and the substrate, and the protective insulation pattern and the second sidewall of the transfer gate. In this embodiment of the invention, the gate spacer further comprises a portion formed of any material, but preferably of the same material as the buffer oxide pattern.

BRIEF DESCRIPTION OF THE DRAWINGS

The aforementioned features of the present invention will become more apparent to those of ordinary skill in the art with the detailed descriptions of the preferred embodiments of the invention as illustrated in the drawings that follow:

FIG. 4A is a cross-sectional view illustrating an image sensor in accordance with an embodiment of the present invention;

DETAILED DESCRIPTION OF PREFERRED EMBODIMENTS

Figure 1:
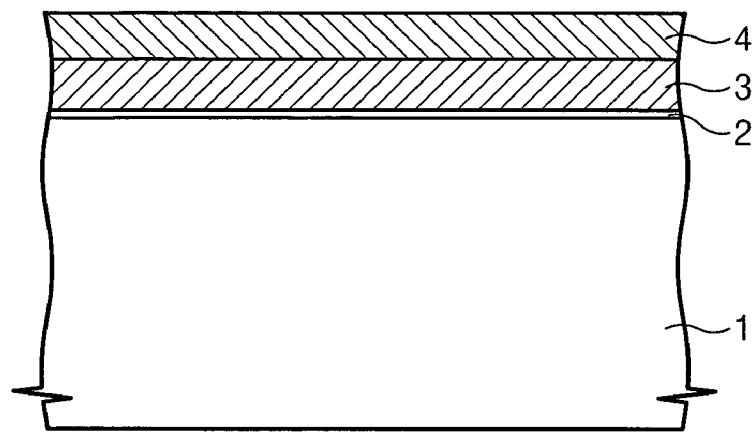
FIGS. 1 and 2 are cross-sectional views illustrating a method for forming a conventional CMOS image sensor.
Figure 2:
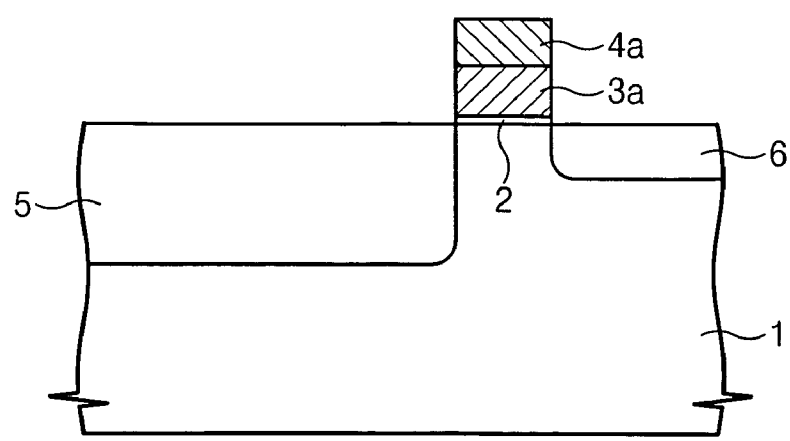

The present invention, hereinafter, will be described with reference to the accompanying drawings, showing preferred embodiments of the invention. In the drawings, the thickness of layers and regions are exaggerated for clarity. It will also be understood that when a layer is referred to as being "on" another layer or substrate, it can be "directly on" the other layer or substrate; or, intervening layers may also be present.

Figure 3:
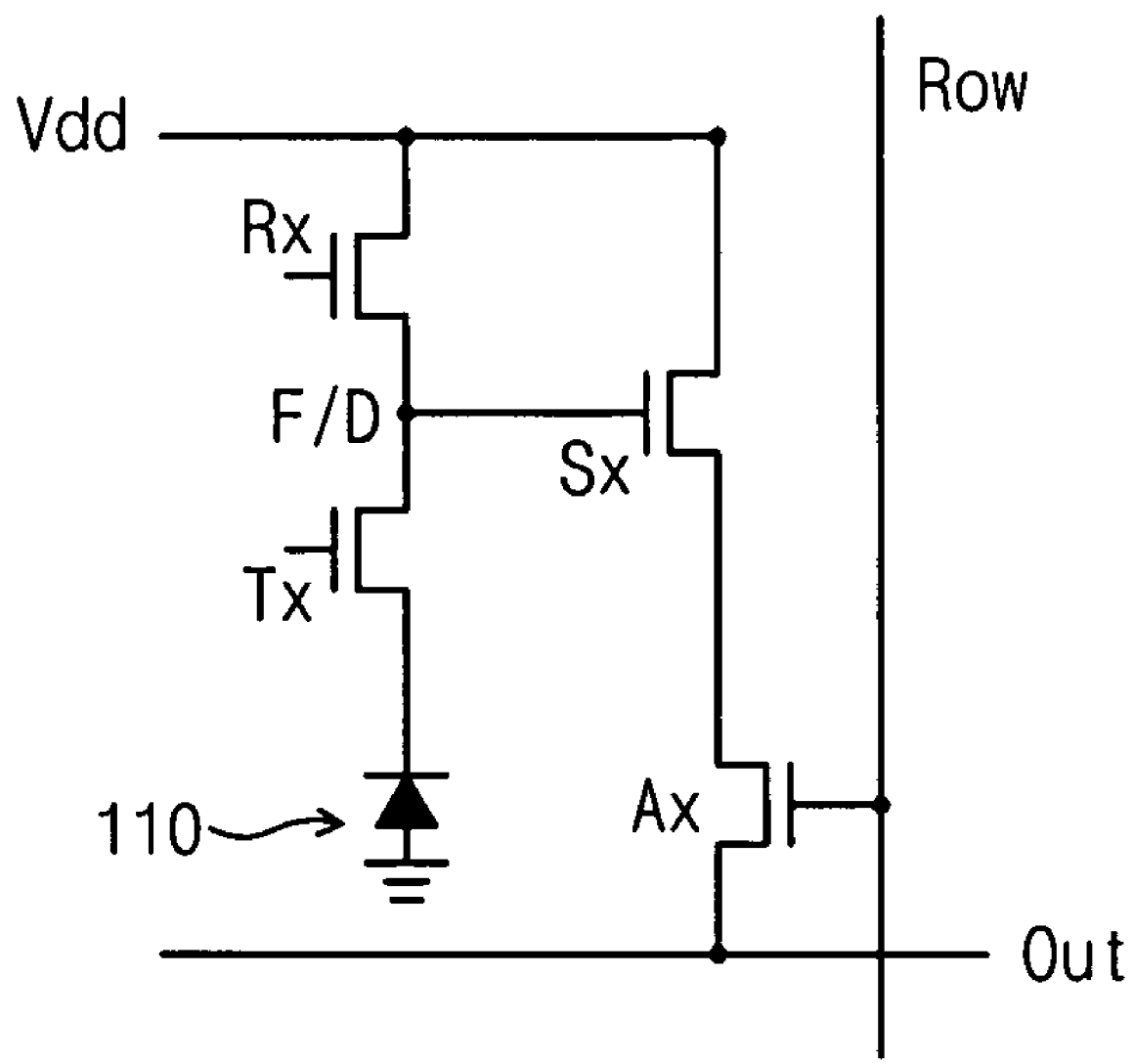
FIG. 3 is an equivalent circuit diagram of a pixel structure of an image sensor in accordance with an embodiment of the present invention.

FIG. 3 is an equivalent circuit diagram of a pixel structure of an image sensor in accordance with an embodiment of the present invention.

Referring to FIG. 3, a pixel of a CMOS image sensor in accordance with an embodiment of the present invention includes a light receiving element 110 sensing an external light and MOS transistors controlling a transfer and/or an output of the charges stored in the light receiving element 110. The pixel may include a plurality of MOS transistors. In an embodiment of the invention, a pixel including four MOS transistors will now be described.

The pixel includes a light receiving element 110, a transfer transistor Tx, a reset transistor Rx, a source follower transistor Sx and an access transistor Ax. It is preferable that the light receiving element 110 is composed of photodiodes. The light receiving element 110 is connected in series with the transfer transistor Tx and the reset transistor Rx. A source of the transfer transistor Tx is connected with the light receiving element 110, and a drain of the transfer transistor Tx is connected with a source of the reset transistor Sx. The power supply voltage Vdd is applied to the drain of the reset transistor Sx.

The drain of the transfer transistor Tx or a source of the reset transistor Sx corresponds to a floating diffusion F/D layer. The floating diffusion F/D layer is connected to a gate of the source follower transistor Sx. The source follower transistor Sx is connected in series with the access transistor Ax. Thus, a source of the source follower transistor Sx is connected to a drain of the access transistor Ax. The drain of the source follower transistor Sx is applied by the power supply voltage Vdd. A source of the access transistor Ax corresponds to an output terminal Out, and a gate of the access transistor Ax is applied by a selection signal Row.

An operation of the pixel having the above mentioned structure now will be described. First, the reset transistor Rx is turned on to make a shift of the floating diffusion F/D layer the same as the power supply voltage Vdd, and then reset transistor Rx is turned off. This operation is defined as a reset operation.

If an external light is impinged on the light receiving element 110, electron-hole pairs EHP are produced in the light receiving element 110, and signal charges are accumulated in the light receiving element 110. Subsequently, the transfer transistor Tx is turned on to move signal charges accumulated in the light receiving element 110 to the floating diffusion F/D. Accordingly, there occurs a simultaneous change of a shift of the floating diffusion F/D layer and a shift of a gate of the source follower transistor Sx. At this time, if the access transistor Ax is turned on by a selection signal Row, an output of data is sent to the output terminal Out. After the output of data, the pixel performs a reset operation again. The pixel repeats these processes, and transforms an optical image into an electric signal and outputs the same.

A structure of the pixel including the four MOS transistors has been described. In contrast, however, the number of the MOS transistors included in a CMOS image sensor according to an embodiment of the present invention is not limited to four. Further, a pixel of an image sensor according to another embodiment of the present invention may include more than two MOS transistors.

Figure 4B:
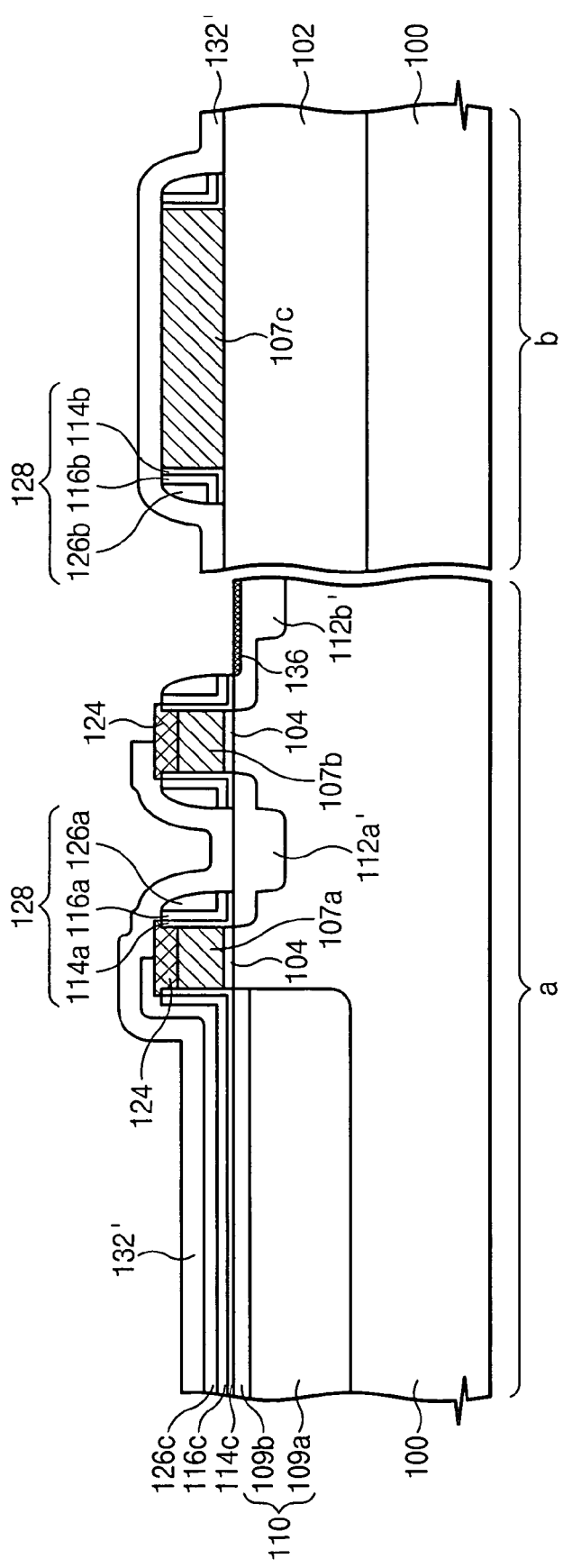
FIG. 4B is a cross-sectional view illustrating a modified example of an image sensor in accordance with an embodiment of the present invention.

FIGS. 4A and 4B are cross-sectional views illustrating an image sensor in accordance with an embodiment of the present invention.

Referring to FIG. 4A, a device isolation layer 102 is formed at a predetermined region of a substrate 100 having a pixel region "a" and a resistor region "b". The device isolation layer 102 defines an active region at the pixel region "a". The device isolation layer 102 is disposed at the resistor region "b".

A transfer gate 107a and a reset gate 107b which are set apart from each other; and are disposed at an active region of the pixel region "a", and a gate insulating layer 104 is interposed between the gates 107a and 107b and the substrate 100. Gates (not shown) of the source follower transistor distinct from the gates of the access transistor are disposed on the active region. In addition, gates (not shown) of a peripheral circuit transistor at a peripheral circuit region of a CMOS image sensor may be disposed on the substrate 100. A resistor device 107c is disposed on the device isolation layer 102 at the resistor region "b". The gates 107a and 107b may be formed of a first doped polysilicon, and the resistor device 107c may be formed of a second doped polysilicon.

The gates 107a and 107b and the resistor device 107c may be doped with impurities at different concentrations. In an embodiment of the invention, an impurity concentration of the gates 107a and 107b may be higher than that of the resistor device 107c. In other words, a resistivity of the gates 107a and 107b may be lower than the resistivity of the resistor device 107c.

The metal gate silicide 124 formed with a selective silicidation process using a metallic gate layer is formed on an upper portion of the gates 107a and 107b. The metal gate layer may be formed made of any metal, but most preferably is made of cobalt, nickel or titanium. The metal gate silicide 124 may be made of any metal silicide, but most preferably is made of cobalt silicide, nickel silicide or titanium silicide.

A light receiving element 100 is disposed at the active region at one side of the transfer gate 107a away from and opposite to the reset gate 107b. The light receiving element 110 may include the first photodiode 109a having a predetermined depth from the surface of the active region and the second photodiode 109b disposed on the upper portion of the first photodiode 109a or a surface of the active region. The first photodiode 109a corresponds to a region doped with the first conductive impurities, and the second photodiode 109b corresponds to a region doped with the second conductive impurities. For example, the first photodiode 109a is doped with n-type impurities, and the second photodiode 109B is doped with p-type impurities.

An impurity doping layer 112a' and 112b' is formed at the active region of a side of the transfer gate 107a away from and opposite to the light receiving element 110, and at the active region of both sides of the reset gate 107b. The impurity doping layer 112a' between the transfer gate 107a and the reset gate 107b corresponds to a floating diffusion layer 112a', and the impurity doping layer 112b' at a side of the reset gate 107b away from and opposite to the floating diffusion layer 112a' corresponds to a source/drain region 112b' of the reset transistor. Thus, the light receiving element 110 is located at one side of the transfer gate 107a away from and opposite to the floating diffusion layer 112a', and the source/drain region 112b' is located at one side of the reset gate 107b away from and opposite to the floating diffusion layer 112a'. The floating diffusion layer 112a' and the source/drain region 112b' may have a lightly doped drain LDD structure or a double diffused drain DDD structure.

A gate spacer 128 is formed at both sidewalls of the gates 107a and 107B. The gate spacer 128 may include the first, the second and the third sidewall patterns 114a, 116a and 126a, which are sequentially stacked. The first and the second sidewall patterns 114a and 116a have an "L" shape, and the third sidewall pattern 126a may have a spacer shape. If the gate spacer 128 includes the first sidewall pattern 114a, the metal gate silicide 124 may cover the uppermost surface of the first sidewall pattern 114a.

A remaining spacer 129 may be disposed on sidewalls of the resistor device 107c. The remaining spacer 129 may include the first, the second and the third remaining patterns 114b, 116b and 126b, which are sequentially stacked. The first remaining pattern 114b is formed of the same material as the first sidewall pattern 114a, and the second remaining pattern 116b is formed of the same material as the second sidewall pattern 116a. In addition, the third remaining pattern 126b may be formed of the same material as the third sidewall pattern 126a.

A silicide prevention pattern 132 covering the light receiving element 110 and the floating diffusion layer 112a' is formed on the substrate 100. In addition, the silicide prevention pattern 132 covers the metal gate silicide 124 and the gate spacer 128 on the transfer gate 107a between the light receiving element 110 and the floating diffusion layer 112a'. Moreover, the silicide prevention pattern 132 is laterally extends to cover the gate spacer 128 at a sidewall of the reset gate 107b adjacent to the floating diffusion layer 112a' and at least a part of the upper surface of the gate metal silicide 124.

A source/drain metal silicide 136 is located on a surface of the source/drain region 112b'. The source/drain metal silicide 136 is formed at a portion other than the portion covered by the gate spacer 128 of an upper portion of the source/drain region 112a'. The source/drain metal silicide 136 is formed by a selective silicidation process using a source/drain metal layer. The source/drain metal silicide 136 may be formed of any metal silicide, but preferably formed of cobalt silicide, nickel silicide, titanium silicide and similar materials or combinations thereof. In other words, the source/drain metal layer may be formed of any metal, but preferably formed of cobalt, nickel, titanium, and similar materials or combinations thereof.

The gate metal gate silicide 124 is formed by a silicidation process using the metal gate layer, and the source/drain metal silicide 136 is formed by a silicidation process using the source/drain metal layer. In other words, the metal gate silicide 124 and the source/drain metal silicide source/drain 136 are formed by the different metal layers. Accordingly, the metal gate silicide 124 and the source/drain metal silicide 136 may include any of the aforementioned different metals. As a result, the metal gate silicide 124 and the source/drain metal silicide 136 may include any metal, but preferably, metals optimized for each function.

For example, the lower resistivity metal gate silicide 124 is required to improve an operational speed of a CMOS image sensor. Accordingly, the metal gate silicide 124 may be formed of cobalt silicide or nickel silicide that possesses relatively low resistivity. On the other hand, the source/drain metal silicide 136 plays a role as an Ohmic layer for reducing a contact resistance between the source/drain region 112a' and a contact plug (not shown) contacting the source/drain region 112a'. Accordingly, if the lowest surface of the contact plug is formed of titanium or titanium nitride, the source/drain metal silicide 136 may be formed of titanium silicide to reduce an interfacial resistance with the contact plug. Thus, when the source/drain metal silicide 136 and lowest surface of the contact plug are made of the same material, an interfacial resistance between them is reduced.

Consequently, the metal gate silicide 124 and the source/drain metal silicide 136 have the optimum characteristics for each function. In turn, these attributes become part of the optimized characteristics a CMOS image sensor.

In another embodiment of the present invention, in the CMOS image sensor with the aforementioned structure, the gate spacer 128 is formed at both sidewalls of the transfer gate 107a adjacent to the light receiving element 110. This configuration is described with reference to FIG. 4B.

FIG. 4B is a cross-sectional view illustrating a modified embodiment of the present invention of an image sensor.

In FIG. 4B, a light receiving element 110 is disposed at an active region of one side of the transfer gate 107a, and a floating diffusion layer 112a' is disposed at an active region at the other side of the transfer gate 107a. A sequentially stacked structure of a buffer oxidation pattern 114c, a protection insulation pattern 116c and a spacer insulation pattern 126c are disposed on the light receiving element 110. The protection insulation pattern 116c laterally extends to cover the first sidewall of the transfer gate 107a adjacent to the light receiving element 110. The buffer oxidation pattern 114c laterally extends and interposed between an extended portion of the protection insulation pattern 116c and the first sidewall of the transfer gate 107a. Then, the metal gate silicide 124 on the transfer gate 107a may cover the uppermost surface of the extended portion of the buffer oxide pattern 114c. The spacer insulation pattern 126c laterally extends to cover an extended portion of the protective insulation pattern 116c located on the first sidewall of the transfer gate 107c. In addition, the spacer insulation layer 126c laterally extends to cover a part of the metal gate silicide 124 on the transfer gate 107c.

A gate spacer 128 is formed at the second sidewall of the transfer gate 107a adjacent to the floating diffusion layer 112a'. As described above, the gate spacer 128 includes the first, the second and the third sidewall patterns 114a, 116a and 126a, which are sequentially stacked. The first sidewall pattern 114a and the buffer oxide pattern 114c are formed of the same material. The second sidewall pattern 116a and the protection insulation pattern 116c are formed of the same material, and the third sidewall pattern 126a and the spacer insulation pattern 126c are formed of the same material.

A silicide prevention pattern 132' covers the spacer insulation pattern 126c and the floating diffusion layer 112a' on the light receiving element 110. In addition, the silicide prevention pattern 132' covers the gate spacer 128 formed at the second sidewall of the transfer gate 107a and the gate metal silicide 124 on the transfer gate 107a between the light receiving element 110 and the floating diffusion layer 112a'. Moreover, the silicide prevention pattern 132' laterally extends to cover the gate spacer 128 formed at a sidewall of the reset gate 107b adjacent to the floating diffusion layer 112a' and at least a part of an upper surface of the gate metal silicide 124 on the reset gate 107b. The silicide prevention pattern 132' also covers a resistor device 107c of at the resistor region "b".

In the above structure of a CMOS image sensor, the buffer oxide pattern 114c, the protection insulation pattern 116c and the spacer insulation pattern 126c covering the light receiving element 110 are formed at the first sidewall of the transfer gate 107a, and the gate spacer 128 is located at the second sidewall of the transfer gate 107a. The first, the second and the third sidewall patterns 114a, 116a and 126a are made of the same material as the buffer oxide pattern 114c, the protective insulation pattern 116c and the spacer insulation pattern 126c, respectively. Thus, the light receiving element 110 is covered with the patterns 114c, 116c and 126c during an anisotropic etching process for forming the gate spacer 128. As a result, it is possible to prevent the increase of dark signals caused by lattice defects due to an etching damage of the light receiving element 110.

FIGS. 5 to 12 are cross-sectional views for illustrating a method for forming an image sensor in accordance with an embodiment of the present invention.

Figure 5:
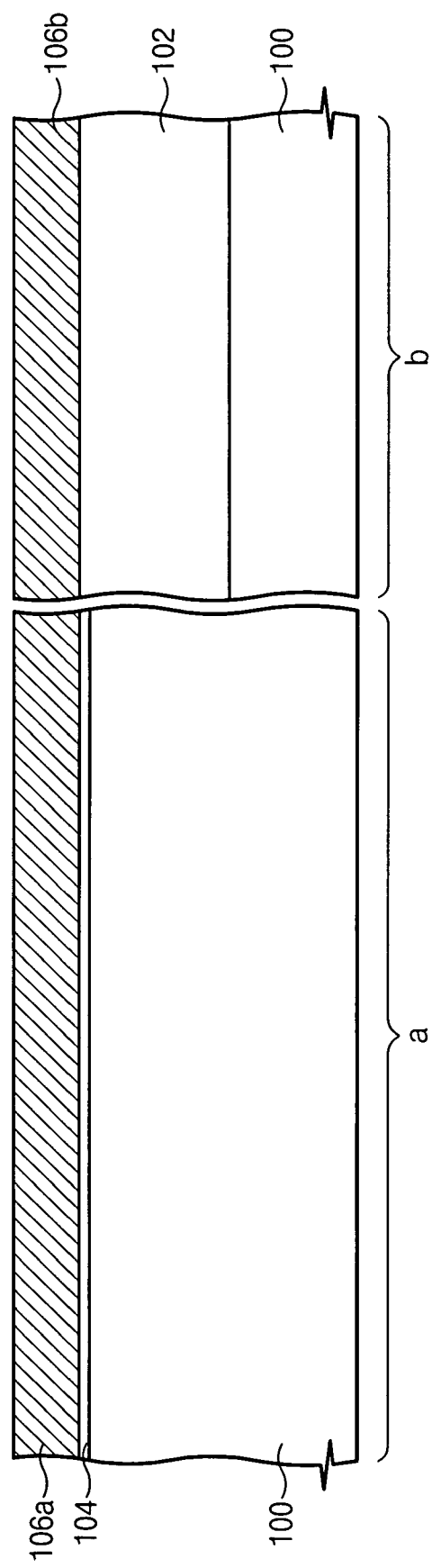
FIGS. 5 to 12 are cross-sectional views illustrating a method for forming an image sensor in accordance with an embodiment of the present invention.

In FIG. 5, a device isolation layer 102 is formed at a predetermined region of a substrate 100 having a pixel region "a" and a resistor region "b". The device isolation layer 102 defines an active region of the pixel region "a". In addition, the device isolation layer 102 is also located in the resistor region "b". In the drawings, the pixel region "a" is a view taken along a line of the active region.

A gate insulating layer 104 is formed on the substrate 100. The gate insulating layer 104 may be formed of a thermal oxide layer. The first doped polysilicon layer 106a at the pixel region "a" and the second doped polysilicon layer 106b at the resistor region "b" are formed on the substrate 100 having the gate insulating layer 104. The first doped polysilicon layer 106a is formed by gates of MOS transistors included in a pixel of the CMOS image sensor, and the second doped polysilicon layer 106b is formed by a resistor device at a peripheral circuit region of the CMOS image sensor. Although not shown, the first doped polysilicon layer 106a may be formed at a portion where peripheral circuit transistors of the peripheral circuit region are formed. At this time, the first doped polysilicon layer 106a at the peripheral circuit region may be formed by the gates of the peripheral circuit transistors.

The first and the second doped polysilicon layers 106a and 106b may have the different impurity concentration. In particular, it is preferable that an impurity concentration of the first doped polysilicon layer 106a may be higher than that of the second doped polysilicon layer 106b.

In another embodiment of the invention, a method for forming the first and the second doped polysilicon layers 106a and 106b having the different impurity concentrations will now be described. First, an undoped polysilicon layer is formed on a surface of the substrate 100 having the gate insulating layer 104. Subsequently, impurity ions of first dose are selectively implanted into the undoped polysilicon layer 106a at the pixel region "a" to form the first doped polysilicon layer 106a, and impurity ions of a second dose are selectively implanted into the undoped polysilicon layer at the resistor region "b" to form the second doped polysilicon layer 106b. After impurity ions of the first and the second doses are implanted, a thermal treatment may be performed to activate the implanted impurities. The first and the second doses are controlled so that the first and the second doped polysilicon layer 106a and 106b have the different impurity ions. Preferably, the first dose is higher than the second dose so that an impurity concentration of the first doped polysilicon layer 106a is higher than that of the second doped polysilicon layer 106b. For this reason, a resistivity of the first doped polysilicon layer 106a may be lower than that of the second doped polysilicon layer 106b.

In the aforementioned method, the first and the second doped polysilicon layer 106a and 106b may have different resistivities. The first doped polysilicon layer 106a may have a resistivity value and an impurity concentration level which are required by a gate of the MOS transistors of the pixel, and the second doped polysilicon layer 106b may have a resistivity value which is required by the resistor device. In summary, a single-layered undoped polysilicon layer is formed on the substrate 100, and impurities are selectively doped to meet the required characteristics of both the resistor device and the gate.

A method for forming the first and the second doped polysilicon layers 106a and 106b having the same level of impurity will be described. First, an undoped polysilicon layer is formed on a surface of the substrate 100 having the gate insulating layer 104, and a predetermined dose of impurity ions are implanted on the surface of the undoped polysilicon layer to form the first and the second doped polysilicon layers 106a and 106b. Then, a thermal treatment follows for activating injected impurities. In another method, a doped polysilicon layer is formed in-situ on a front surface of the substrate 100 having the gate insulating layer 104 to form the first and the second doped polysilicon layers 106a and 106b.

Figure 6:
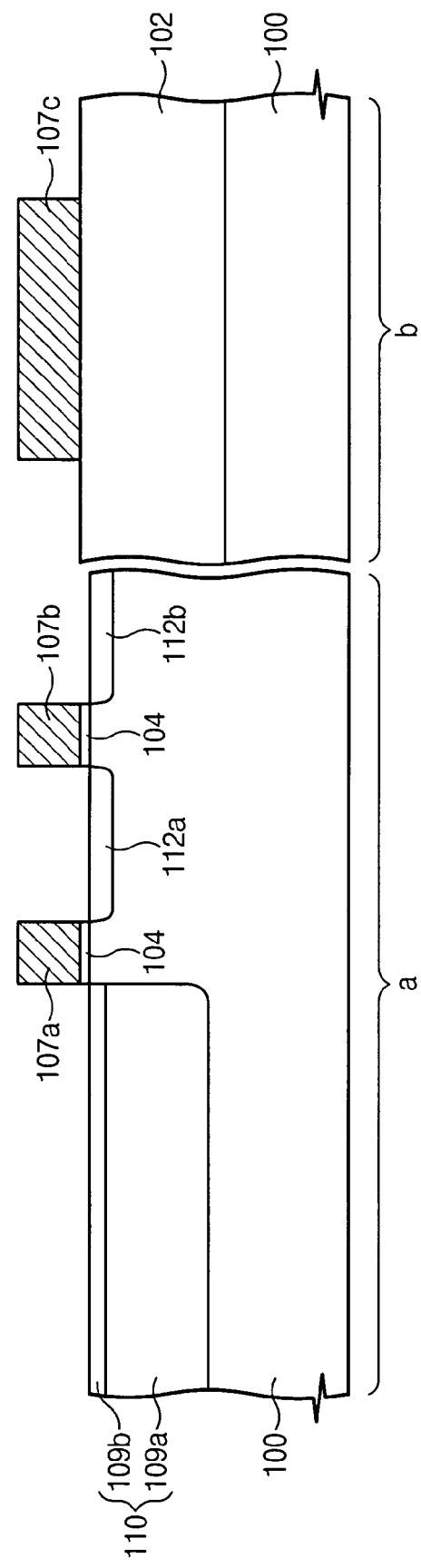

Referring to FIG. 6, the first doped polysilicon layer 106a is patterned to set apart on the active region the transfer gate 107a and the reset gate 107b. Although not shown in FIG. 6, when the transfer and the reset gates 107a and 107b are formed, gates of the source follower transistor and the access transistor in FIG. 3 may be formed at the same time. The first doped polysilicon layer 106a is patterned to form the gates of the source follower and the access transistors. In addition, the gates (not shown) of the peripheral circuit transistors may be formed together with the transfer and the reset gates 107a and 107b.

The second doped polysilicon layer 106b is patterned to form a resistor device 107c on the device isolation layer 102 at the resistor region "b". The role of the resistor device 107c is to control a voltage or a current of the CMOS image sensor. It is preferable that the gates 107a and 107b and the resistor device 107c are formed at the same time.

A light receiving element 110 is formed at the active region of one side of the transfer gate 107a away from and opposite to the reset gate 107b. It is preferable that the light receiving element 110 includes photodiodes 109a and 109b. The method for forming the light receiving element 110 includes the following steps: the first conductive impurity ions are selectively implanted into an active region at one side of the transfer gate 107a to form the first photodiode 109a. Next, the second conductive impurity ions are selectively implanted into the second photodiode 109b, which is formed on top of the first photodiode 109a. For example, the first photodiode 109a may be doped with n-type impurities, and the second photodiode 109b may be formed with p-type impurities.

The impurity ions are selectively implanted into the active region of one side of the transfer gate 107a away from and opposite to the light receiving element 110 and on both sides of the reset gate 107b to form the impurity doping layers 112a and 112b. The impurity doping layers 112a and 112b may be doped with the same type impurities as the first photodiode 109a. The impurity doping layer 112a between the transfer gate 107a and the reset gate 107b corresponds to a floating diffusion layer 112a. The impurity doping layer 112b at one side of the reset gate 107b opposite to the floating diffusion layer 112a corresponds to a source/drain region 112b of the reset transistor. A reference numeral "112a" refers to an impurity doping layer and a floating diffusion layer, and a reference numeral "112b" refers to an impurity doping layer and a source/drain region.

When the floating diffusion layer 112a and the source/drain region 112b are formed, source/drain regions (not shown) of the source follower transistor and the access transistor may be formed.

It is preferable that the light receiving element 110 and the impurity doping layers 112a and 112b are sequentially formed. For example, after the light receiving element 110 is formed, the impurity doping layers 112a and 112b are formed. Alternatively, after the impurity doping layers 112a and 112b are formed, the light receiving element 110 may be formed.

After the gates 107a and 107b are formed, numerous wet cleaning processes may be carried out on the substrate 100. Consequently, it is possible to prevent the increase of dark signals due to metal contamination during conventional wet processes that the light receiving element 110 may be subjected to.

Figure 7:
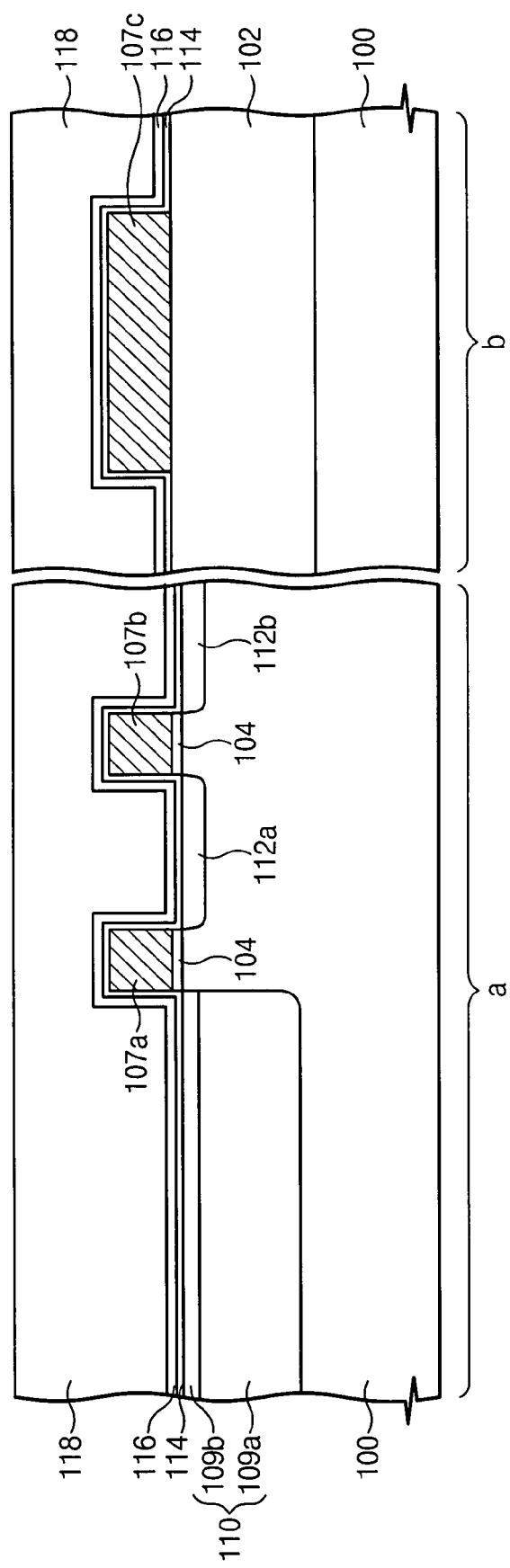

Referring to FIG. 7, an insulation layer 116 is formed on an entire surface of the substrate 100, and a mold layer 118 is formed on the insulation layer 116. It is preferable that the mold layer 118 formed at both sides of the gates 107a and 107b is of adequate thickness that it has an upper surface higher than an upper surface of the gates 107a and 107b.

The insulation layer 116 is an insulation layer having an etch selectivity with respect to the mold layer 118. In addition, it is preferable that the insulation layer 116 is a layer resistant to a silicide coating process. For example, the mold layer 118 may be a silicon oxide layer formed with a chemical vapor deposition method or a spin coating method. In this case, the insulation layer 116 may be formed of a silicon nitride layer.

Before the insulation layer 116 is formed, a buffer oxide layer 114 may be formed on an entire surface of the substrate 100. The buffer oxide layer 114 is formed between the substrate 100 and the insulation layer 116 to relieve stress between the insulation layer 116 and the substrate 100. It is preferable that the buffer oxide layer 114 is formed of an oxide layer having a slow etch rate in comparison with the mold layer 118. For example, the buffer oxide layer 114 may be formed of a thermal oxide layer.

Figure 8:
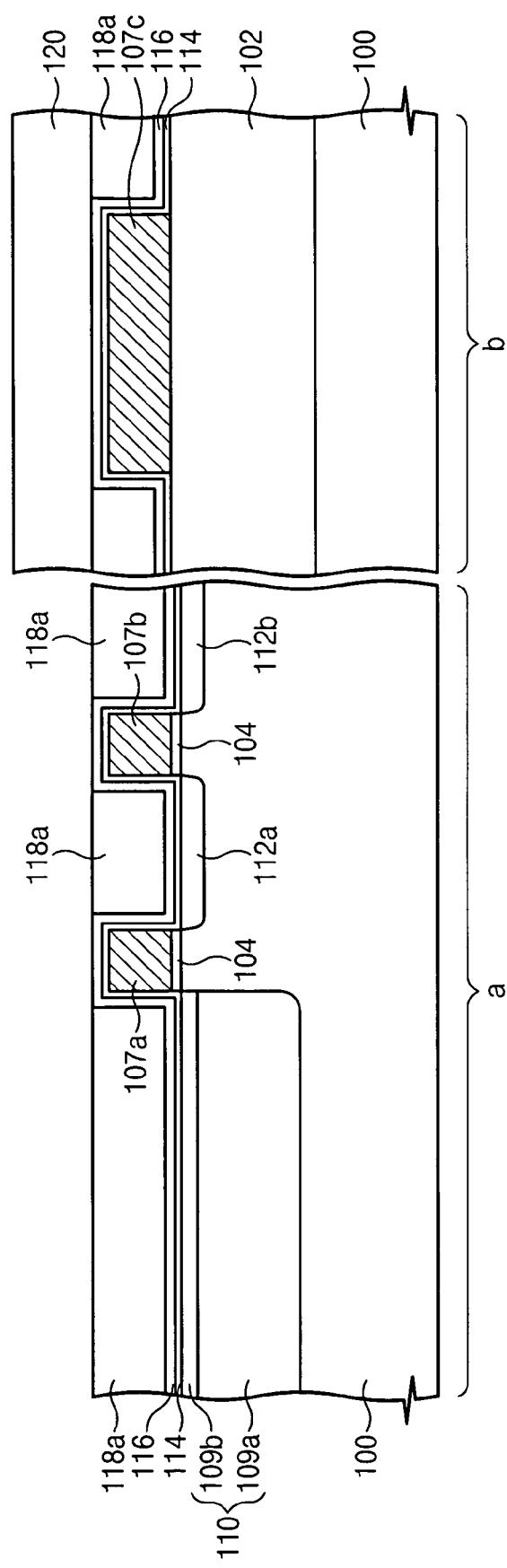

Referring to FIG. 8, the mold layer 118 is planarized until the insulation layer 116 formed on the upper surface of the gates 107A and 107B is exposed. At this time, the insulation layer 116 formed on the upper surface of the resistor device 107c is also exposed. The mold layer 118 may be planarized by a chemical mechanical polishing process. The planarized mold layer 118a covers the insulation layer 116 formed at both sides of the gates 107a and 107b.

Subsequently, a mask pattern 120 is formed on the substrate 100. The mask pattern 120 may be formed of a photoresist. The mask pattern 120 is formed at the resistor region "b". In other words, the mask pattern 120 covers the insulation layer 116 exposed on top of the resistor device 107C. The mask pattern 120 does not cover the pixel region "a". Accordingly, the insulation layer 116 on the gates 107a and 107b is exposed. In addition, the insulation layer 116 on the gates (not shown) of the source follower transistor and the access transistor may be exposed. Furthermore, the insulation layer 116 on the gates (not shown) of the peripheral circuit transistor may be exposed.

Figure 9:
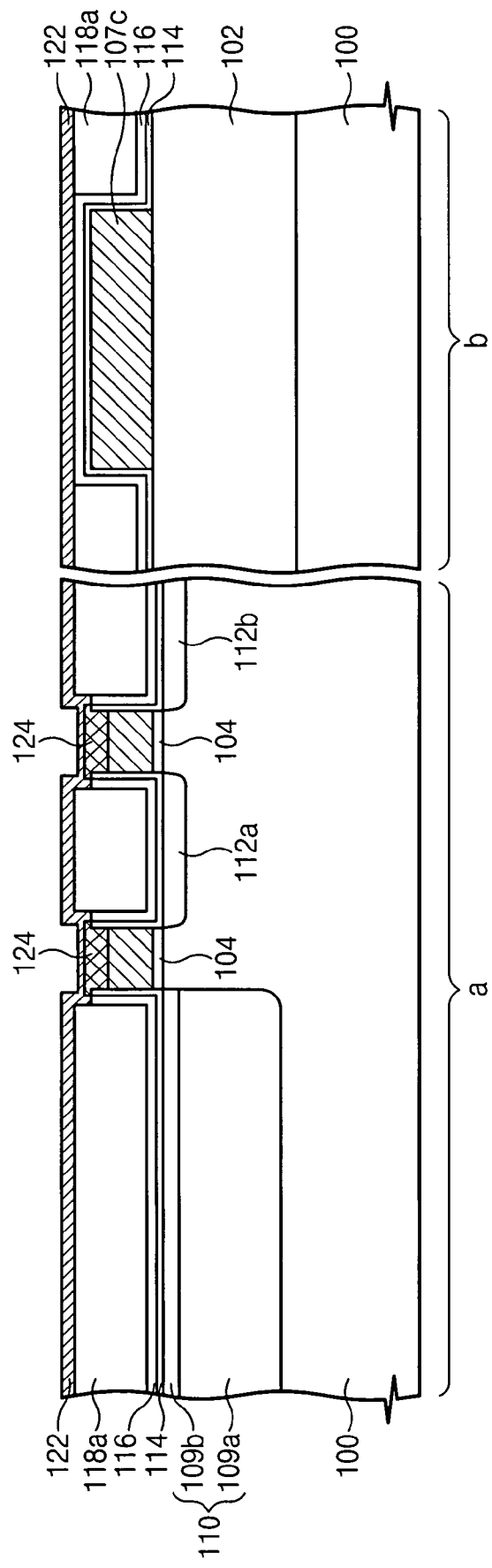

Referring to FIG. 9, the exposed insulation layer 116 and the buffer oxide layer 114 are etched selectively using the mask pattern 120 to expose an upper surface of the gates 107a and 107b. Subsequently, the mask pattern 120 is removed. The upper surfaces of the gates (not shown) of the source follower and the access transistors and the upper surfaces of the gates (not shown) of the peripheral circuit transistor are exposed.

The first selective silicidation process is performed on the substrate 100 to form metal gate silicide 124 on the exposed gates 107a and 107b. The first selective silicidation process will be described in detail.

First, a metal gate layer 122 is deposited on an entire surface of the substrate 100 having the exposed gate 107a and 107b, and the first thermal treatment process is performed to form metal gate silicide 124 on the exposed gate 107a and 107b. The metal atoms of the metal gate layer 122 are reacted with the silicon atoms of the gates 107a and 107b by the thermal treatment process to form the metal gate silicide 124. At this time, the metal gate silicide 124 may cover the uppermost surface of the buffer oxide layer 114 formed at sidewalls of the gates 107a and 107b. As the resistor device 107c is covered with the insulation layer 116, the metal gate silicide 124 is not formed on the resistor device 107c. The metal gate silicide 124 may be formed on the exposed gates (not shown) of the source follower transistor and the access transistor, and on the exposed gate (not shown) of the peripheral circuit transistor.

Next, the unreacted metal gate layer 122 is removed. Therefore, the first selective silicidation process is completed.

A process for depositing the metal gate layer 122 and the first thermal treatment process may be performed with an in-situ method. The metal gate layer 122 may be formed of any metal, but preferably of cobalt, nickel or titanium. Accordingly, the metal gate silicide 124 may be formed of any metal silicide, but preferably of cobalt silicide, nickel silicide or titanium silicide.

Subsequently, the planarized mold layer 118a is removed from the substrate 100 having the metal gate silicide 124. The buffer oxide layer 114 has a slow etch rate in comparison with the mold layer 118. Therefore, when the planarized mold layer 118a is removed, the buffer oxide layer 114 formed at a sidewall of the gates 107a and 107b is prevented from being etched. In addition, the metal gate silicide 124 may be formed to cover the buffer oxide layer 114 formed at a sidewall of the gates 107a and 107b. Hence, when the planarized mold layer 118a is removed, the buffer oxide layer 114 formed at a sidewall of the gates 107a and 107b is prevented from being etched.

According to the above described method, it is preferable that the gate metal gate silicide 124 is formed, and the planarized mold layer 118a is removed; as opposed to, the planarized mold layer 118a being removed first, and then followed by the metal gate silicide 124 being formed. The latter will now be described with reference to FIG. 13.

Figure 13:
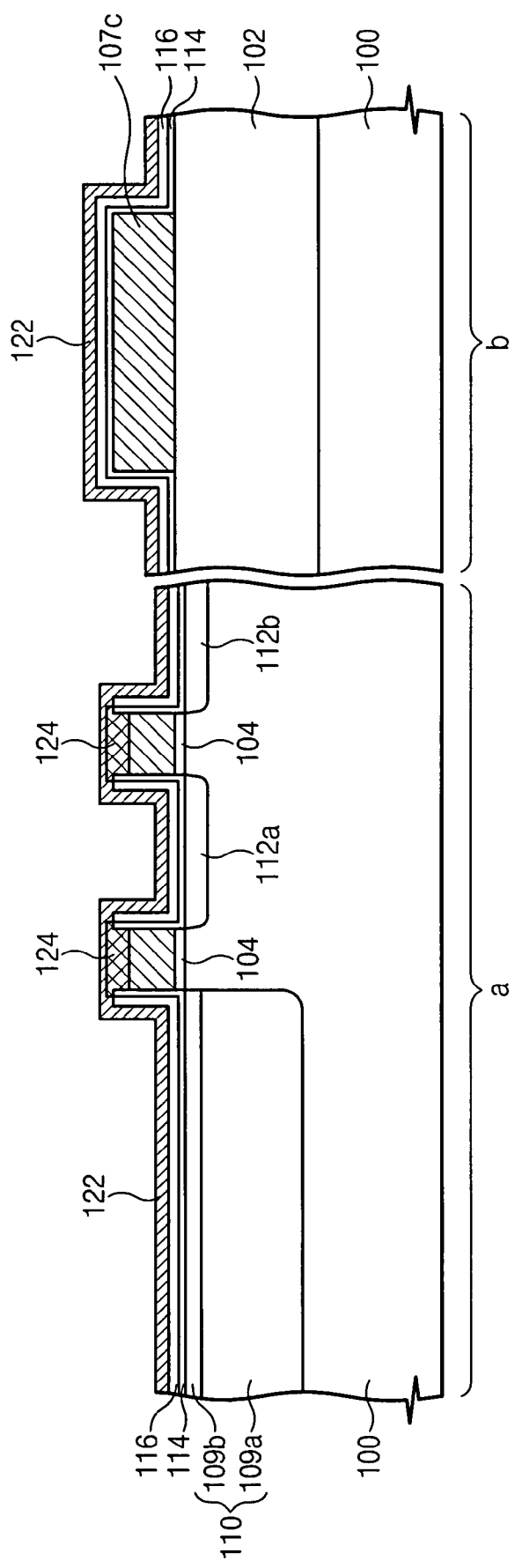
FIG. 13 is a cross-sectional view illustrating another method for forming metal gate silicide of an image sensor in accordance with an embodiment of the present invention.

FIG. 13 is a cross-sectional view illustrating another method for forming metal gate silicide of an image sensor in accordance with an embodiment of the present invention.

Referring to FIGS. 8 and 13, the exposed insulation layer 116 and the buffer oxide layer 114 are etched in series using the mask pattern 120 to expose an upper surface of the gates 107a and 107b; and then remove the mask patterns 120. Subsequently, the planarized mold layer 118a is removed to expose the insulation layer 116 at both sides of the gates 107a and 107b. Also, the buffer oxide layer 114 at a sidewall of the gates 107a and 107b has a slow etch rate in comparison with the planarized mold layer 118a. Accordingly, the buffer oxide layer 114 at sidewalls of the gates 107a and 107b is prevented from being etched when the planarized mold layer 118a is removed. Subsequently, the first selective silicidation process is performed. In other words, a metal gate layer 122 is deposited on an entire surface of the substrate 100, and followed by the first thermal treatment process for silicidation to form the metal gate silicide 124 on the gates 107a and 107b and to remove the unreacted metal gate layer 122.

According to the method, the planarized mold layer 118a is removed first, subsequently; the metal silicide gate 124 is formed to prevent the metal silicide gate 124 from being damaged during a process for removing the mold layer 118a.

Figure 10:
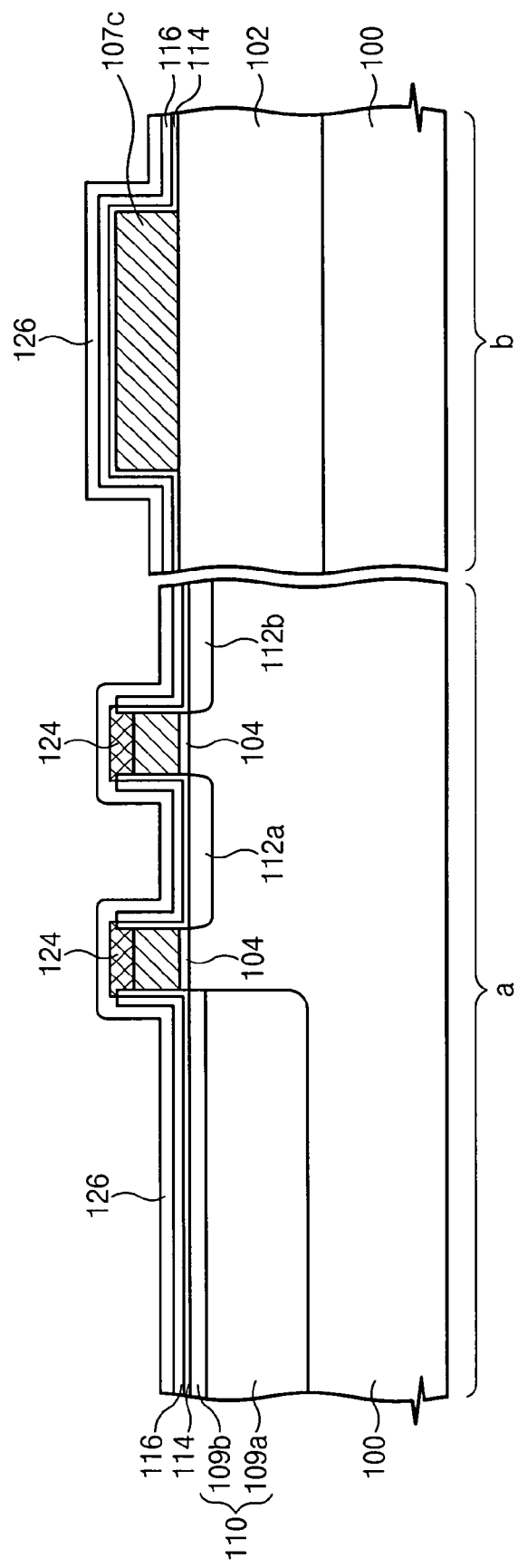

Referring to FIG. 10, a spacer insulating layer 126 is formed in a shape that conforms to and on the substrate 100 from which the unreacted metal gate layer 122 and the planarized mold layer 118a are removed. The spacer insulating layer 126 may be formed of a silicon oxide layer.

Figure 11:
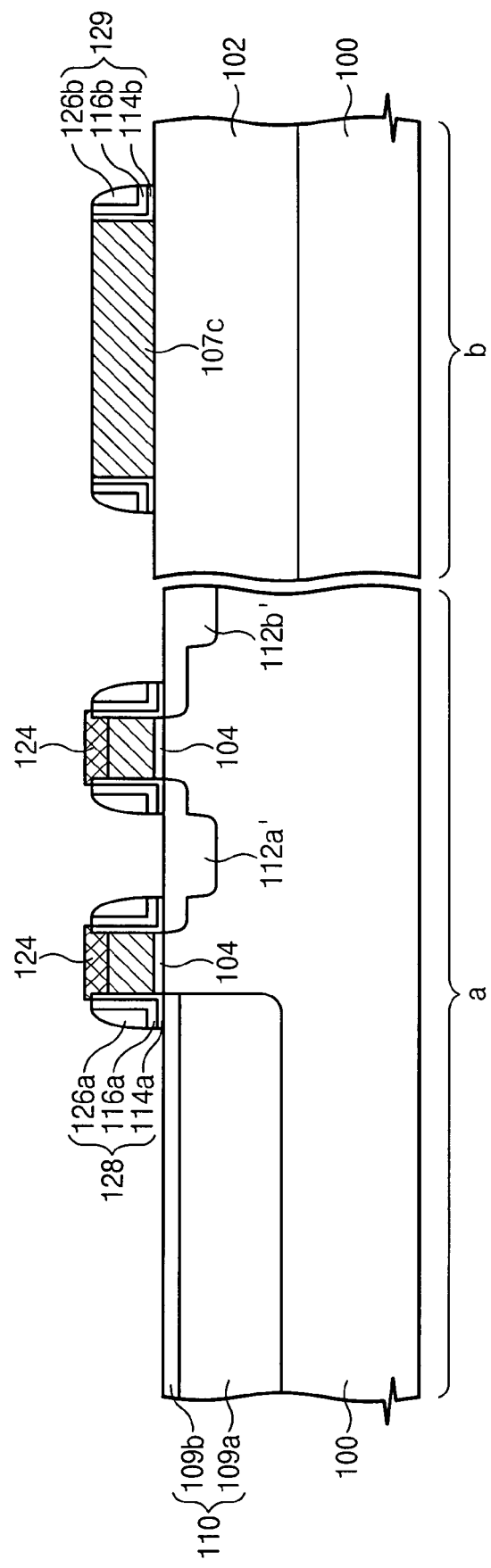

Referring now to FIG. 11, the spacer insulation layer 126, the insulation layer 116 and the buffer oxide layer 114 are isotropically etched in series to form a gate spacer 128 at the opposing sidewalls of the gates 107a and 107b. The gate spacer 128 includes the first, the second and the third sidewall patterns 114a, 116a and 126a, which are sequentially stacked. The first, the second and the third sidewall patterns 114a, 116a and 126a are formed from the buffer oxide layer 114, the insulation layer 116 and the spacer insulation layer 126. The first and the second sidewall patterns 114a and 116a may be formed to have an L-shape, and the third sidewall pattern 126a may be formed to have a spacer shape.

When the gate spacer 128 is formed, an upper surface of the resistor device 107c is exposed and a remaining spacer 129 may be formed at sidewalls of the resistor device 107c. The remaining spacer 129 may include the first, the second and the third remaining patterns 114b, 116b and 126b, which are sequentially stacked. The first, the second and the third remaining patterns 114b, 116b and 126b are formed from the buffer oxide layer 114, the insulation layer 116 and the spacer insulation layer 126.

After the gate spacer 128 is formed, the impurity ions are selectively implanted into layers 112a and 112b to form the impurity doping layers 112a and 112b in a lightly doped drain LDD structure or an impurity doping layers 112a' and 112b' in a double diffused drain DDD structure. Thus, the floating diffusion layer 112a' and the source/drain region 112b' in a LDD structure or a DDD structure may be formed.

Figure 12:
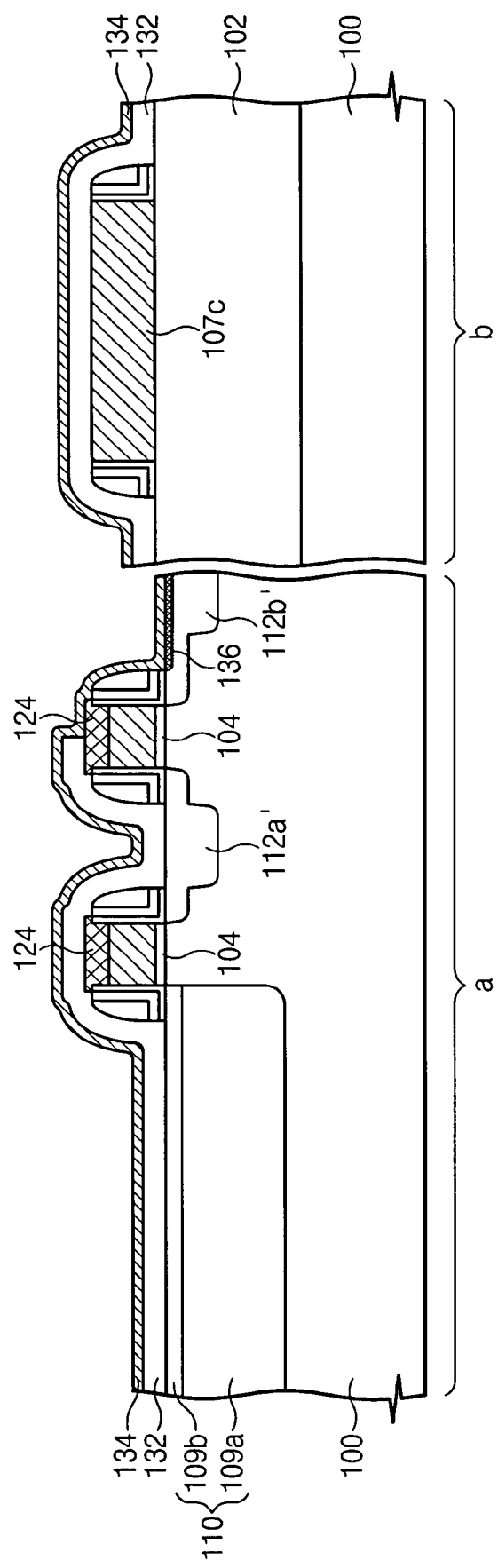

Referring to FIG. 12, a silicide prevention layer is formed on an entire surface of the substrate 100 having the gate spacer 128, and a silicide prevention pattern 132 is formed by patterning on the silicide prevention layer. The silicide prevention pattern 132 covers the light receiving element 110 and the floating diffusion layer 112a'. At this time, the source/drain region 112b' is exposed, as well as, the source/drain regions (not shown) of the source follower transistors, the access transistors (not shown) and the peripheral circuit transistors.

The silicide prevention pattern 132 may cover the transfer gate 107a between the light receiving element 110 and the floating diffusion layer 112a'. In addition, the silicide prevention pattern 132 is formed at the resistor region "b" to cover an exposed upper surface of the resistor device 107c. The silicide prevention pattern 132 may be formed of a silicide preventing insulating layer, for example, a silicon oxide layer.

A second selective silicidation process is performed on the substrate 100 having the silicide prevention pattern 132 to form source/drain metal silicide 136 on a surface of the source/drain region 112b'.

The second selective silicidation process is next described in detail. The process includes: depositing a source/drain metal layer 134 on a substrate 100 having the silicide prevention pattern 132; carrying out the second thermal treatment process and forming source/drain metal silicide 136 on a surface of the source/drain region 112b'. Next, the unreacted source/drain metal layer 134 is removed, thereby completing the second selective silicidation process. Therefore, a CMOS image sensor as shown in FIG. 4A can be made.

It is preferable that the process for depositing the source/drain metal layer 134 and the second thermal treatment process are carried out in-situ. The source/drain metal silicide 136 may be formed on a surface of the exposed source/drain regions (not shown) of the source follower transistors, the access transistors (not shown) and the peripheral circuit transistors.

Since the source/drain metal silicide 136 is not formed on the floating diffusion layer 112a' by the silicidation prevention pattern 132; it is possible to reduce a leakage current of the floating diffusion layer 112a'. In other words, the floating diffusion layer 112a' is at a floating state, as illustrated in FIG. 3. However, if a metal is included in the floating diffusion layer 112a', a leakage current occurs due to the metal, and a shift of the floating diffusion layer 112a' at a floating state is changed. Therefore, a malfunction of an image sensor may be caused. Accordingly, it is preferable that the source/drain metal silicide 136 is not formed on the floating diffusion layer 112a'.

The source/drain metal layer 134 may be formed of cobalt, nickel or titanium. Accordingly, the source/drain metal silicide 136 is formed of cobalt silicide, nickel silicide or titanium silicide.

The metal gate silicide 124 and the source/drain metal silicide 136 are formed by the metal gate layer 122 and the source/drain metal layer 134, respectively. In other words, the metal gate silicide 124 and the source/drain metal silicide 136 are formed of the different metal layers. Accordingly, the metal gate silicide 124 and the source/drain metal silicide 136 are formed of the different metal silicides. Thus the metal gate silicide 124 and the source/drain metal silicide 136 may be formed to have optimized characteristics required by the CMOS image sensor.

For example, the metal gate silicide 124 is required to have a lower resistivity so that an image sensor is operated at a higher speed. Thus, the metal gate silicide 124 may be formed of cobalt silicide or nickel silicide. While the source/drain metal silicide 136 is used as an Ohmic layer for reducing a contact resistivity between the source/drain region 112b' and the contact plug (not shown) connected with the source/drain region 112b'. Therefore, if the lowest surface of the contact plug is formed of titanium or titanium nitride, the source/drain metal silicide 136 may be formed of titanium silicide. In this example, since the lowest surface of the contact plug and the source/drain metal silicide 136 includes the same metal (i.e. titanium), an interfacial resistance between them can be minimized.

As described above, as the gate metal silicide 124 and the source/drain metal silicide 136 are formed from the different metal layers, they may be formed of metal silicides optimized for each function. These optimized attributes, in turn become characteristics of a CMOS image sensor.

Next, in another embodiment of the invention, a method for forming a CMOS image sensor is illustrated in FIG. 4b. This method is similar to the previously described method. In particular, the method may include the steps described with reference to FIGS. 5 to 10.

Figure 14:
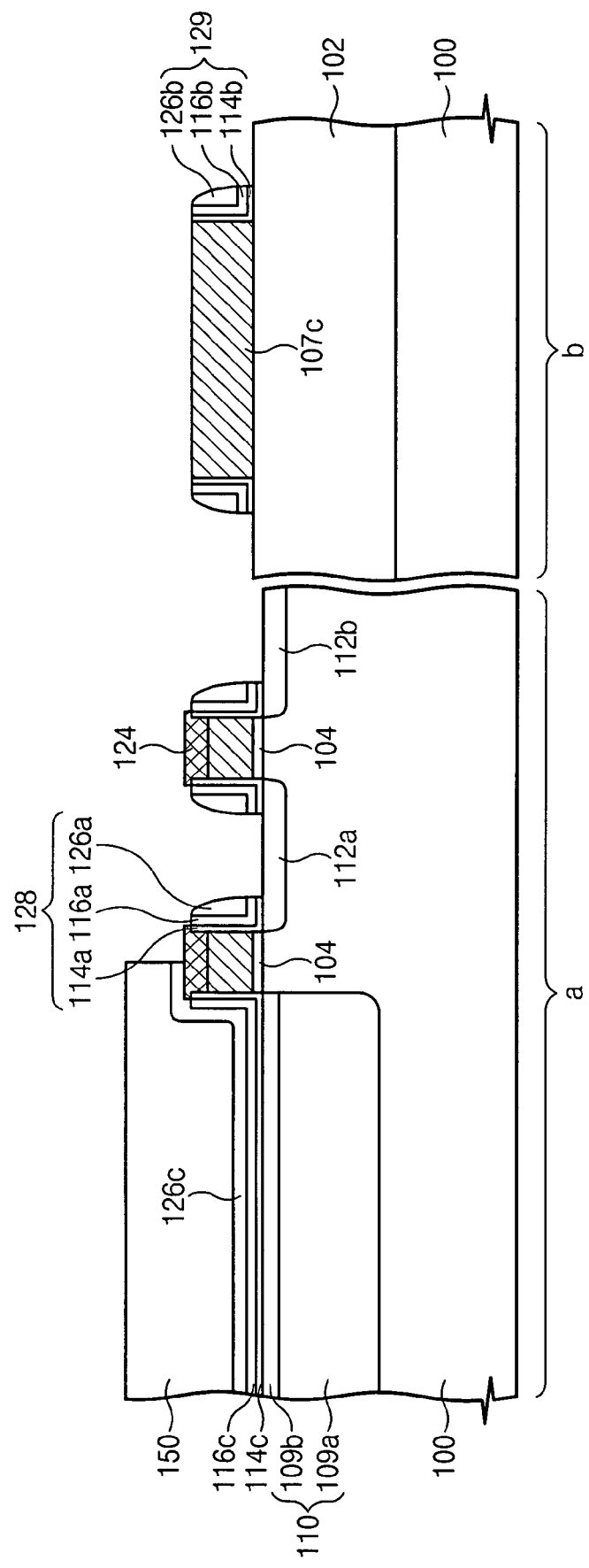
FIGS. 14 and 15 are cross-sectional views illustrating a method for forming a modified example of an image sensor in accordance with an embodiment of the present invention.
Figure 15:
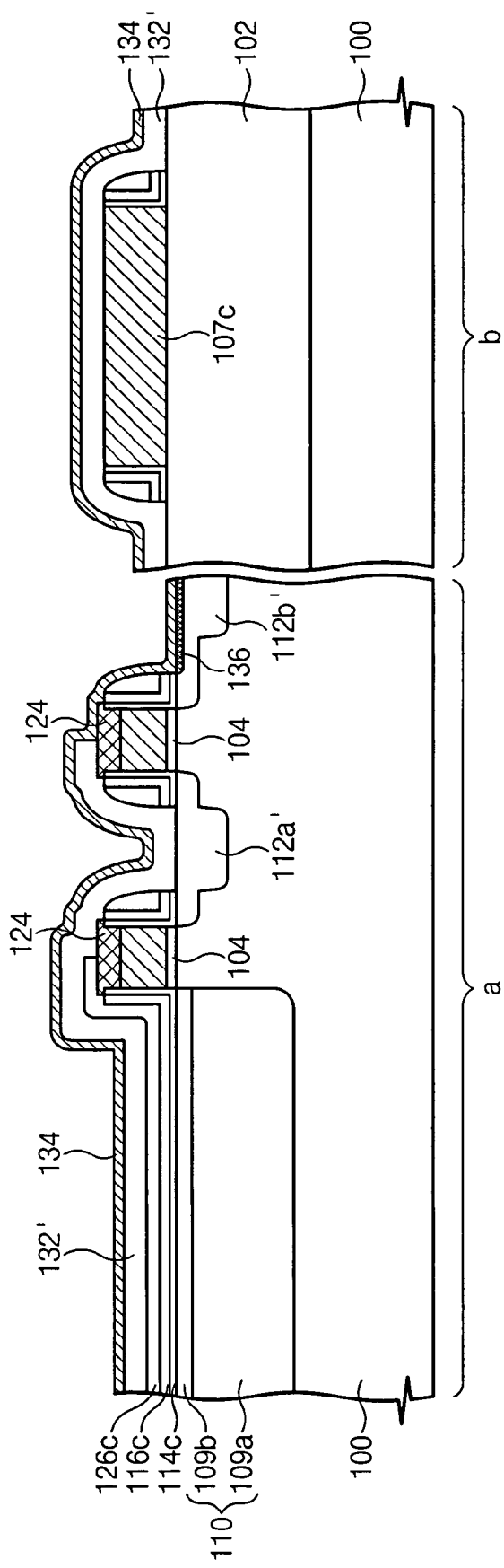

FIGS. 14 and 15 are cross-sectional views illustrating a method for forming a modified example of an image sensor in accordance with an embodiment of the present invention.

Referring to FIGS. 10 and 14, a photoresist pattern 150 is formed on a spacer insulating layer 126 formed on the substrate 100. The steps of forming the spacer insulating layer 126 and the preceding steps of forming the spacer insulating layer are performed in the same method described with references to FIGS. 5 to 10.

The photoresist pattern 150 covers the spacer insulating layer 126 formed on the light receiving element 110. In addition, the photoresist pattern 150 is laterally extended to cover a part of the spacer insulating layer 126 formed on top of the transfer gate 107a. Accordingly, the photoresist pattern 150 covers the first sidewall of the transfer gate 107a adjacent to the light receiving element 110. At this time, it is preferable that the second sidewall of the transfer gate 107b adjacent to the floating diffusion layer 112a is not covered by the photoresist pattern 150. It is preferable that the spacer insulating layer 126 at the resistor region "b" is exposed.

The spacer insulating layer 126, the insulation layer 116 and the buffer oxide layer 114 are anisotropically etched in series using the photoresist pattern 150 to form a gate spacer 128 at the second sidewall of the transfer gate 107a and at both sidewalls of the reset gate 107b. At this time, a sequentially stacked structure of a buffer oxide pattern 114c, an insulation pattern 116c and a spacer insulation pattern 126C is formed on the light receiving element 110. In addition, when the gate spacer 128 is formed, a remaining spacer 129 is formed at sidewalls of the resistor device 107C. The remaining spacer 129 is formed in the same shape as in FIG. 11.

In the above described method, when the gate spacer 128 is formed, a buffer oxide pattern 114C, an insulation pattern 116C and a spacer insulation pattern 126C are formed on the light receiving element 110. In other words, a surface of the light receiving element 110 is not exposed to an anisotropic etching for forming the gate spacer 128. Hence, there is a decrease in the possible dark signals caused by an etching damage of the light receiving element. In turn, a more reliable CMOS image sensor can be made.

Referring to FIG. 15, the photoresist pattern 150 is removed from the substrate. Next, impurity ions are selectively implanted into the floating diffusion layer 112a and the source/drain region 112b, which in turn form the floating diffusion layer 112a' and the source/drain region 112b' in a lightly doped drain LDD structure or a double diffused drain DDD structure.

Still referring to FIG. 15, a silicide prevention layer is formed on an entire surface of the substrate 100 and patterned to form a silicide prevention pattern 132' covering the light receiving element 110 and the floating diffusion layer 112a'. At this time, the silicide prevention pattern 132' covers the spacer insulation pattern 126c on the light receiving element 110. The silicide prevention pattern 132' covers the gate metal silicide 124 on the transfer gate 107a between the light receiving element 110 and the floating diffusion layer 112a' and a gate spacer 128 at the first sidewall and the second sidewall of the transfer gate 107a. In addition, the silicide prevention pattern 132' extends laterally to cover the gate spacer 128 at the sidewall of the reset gate 107b adjacent to the floating diffusion layer 112a' and at least a part of the metal gate silicide 124 on the reset gate 107b.

The aforementioned second selective silicidation process is carried out on the substrate 100 having the silicide prevention pattern 132' to form a source/drain metal silicide 136. In other words, a source/drain metal layer 134 is deposited on the substrate 100 having the silicide prevention pattern 132', and the second thermal treatment for silicidation is carried out to form source/drain metal silicide 136 on a surface of the source/drain region 112b'. Subsequently, the unreacted source/drain metal layer 134 is removed and the second silicidation process is completed.

As described above, according to the present invention, when a patterning process is performed for forming gates, the gates do not include a metal atom. This process where various wet cleaning processes occur after the gates are formed, ensures the prevention of metal contamination of the light receiving element and the floating diffusion layer. In addition, metal gate silicide is formed to align on an entire the upper surface of the gates. Thus, the light receiving element and the impurity doping layers are protected by a single layer of an insulation layer or multiple layers of an insulation layer and a planarized mold layer. Metal contamination to the light receiving element and the floating diffusion layer is prevented; and the low resistivity metal gate silicide is formed on the gates. Thus, the increase of dark signals due to conventional metal contamination is decreased resulting to a high speed CMOS image sensor.

In another embodiment of the invention, the metal gate silicide and source/drain metal silicide formed on a surface of the source/drain region except the floating diffusion layer are formed by a silicidation process using the different metal layers. Accordingly, the gate metal silicide and the source/drain metal silicide may be formed of metal silicides having individual optimized characteristics. In either case, a CMOS image sensor having an optimized characteristic may be formed.

What is claimed is:

1. A method for forming a CMOS image sensor comprising:
   patterning a gate insulating layer and a doped polysilicon layer sequentially stacked on a substrate to form a transfer gate and a reset gate;
   forming a floating diffusion layer between the transfer gate and the reset gate, forming a light receiving element at a side of the transfer gate away from and opposite to the floating diffusion layer, and forming a source/drain region at a side of the reset gate away from and opposite to the floating diffusion layer;
   sequentially forming a protective insulation layer and a mold layer on an entire surface of the substrate;
   planarizing the mold layer until the protective insulation layer is exposed, wherein the protective insulation layer has an etch selectivity with respect to the mold layer;
   removing the exposed protective insulation layer to expose upper surfaces of the transfer gate and reset gate; and
   carrying out a selective silicidation process using a gate metal layer to form a gate metal silicide on each of the exposed transfer gate and reset gate.

2. The method of claim 1, further comprising:
   removing the planarized mold layer;
   forming a gate spacer at least at a sidewall of the transfer gate adjacent to the floating diffusion layer and at both sidewalls of the reset gate, to expose the floating diffusion layer and the source/drain region;
   forming a silicide prevention pattern covering the light receiving element and the floating diffusion layer; and
   carrying out a selective silicidation process using a source/drain metal layer to form source/drain metal silicide on a surface of the exposed source/drain region.

3. The method of claim 2, wherein the removing the planarized mold layer is performed before the gate metal silicide is formed.

4. The method of claim 2, wherein the removing the planarized mold layer is performed after the gate metal silicide is formed.

5. The method of claim 2, wherein the gate metal silicide and the source/drain metal silicide include different metals.

6. The method of claim 2, wherein the step of forming the gate spacer further comprises:
   removing the planarized mold layer and conformally forming a spacer insulating layer on a substrate having the gate metal silicide; and,
   anisotropically etching the spacer insulating layer and the protective insulation layer to form the gate spacer at both sidewalls of the transfer gate and at both sidewalls of the reset gate.

7. The method of claim 2, wherein forming the gate spacer further comprises:
   removing the planarized mold layer, and forming a spacer shaped to conform to the insulating layer on the substrate having the gate metal silicide; and
   selectively and anisotropically etching the spacer insulating layer and the protective insulation layer to form an insulation layer, a spacer insulation pattern and the gate spacer, which sequentially cover a sidewall of the light receiving element and the transfer gate adjacent to the light receiving element.

8. The method of claim 1, before forming the protective insulation layer, further comprising: forming a buffer oxide layer having a slow etch rate in comparison with the mold layer on the substrate,
   wherein exposing the upper surfaces of the gates comprises etching the exposed protective insulation layer and the buffer oxide layer in series to expose the upper surfaces of the gates.

9. The method of claim 8, wherein the gate metal silicide is formed to cover the uppermost surface of the buffer oxide layer formed at sidewalls of the gates.

10. A method for forming a CMOS image sensor comprising:
   sequentially forming a gate insulating layer and an undoped polysilicon layer on a substrate having a resistor region and a pixel region;
   forming the first and the second doped polysilicon layers from the undoped polysilicon layer at the pixel region and the undoped polysilicon layer at the resistor region of the substrate, respectively;
   patterning the first and the second doped polysilicon layer to form a transfer gate and a reset gate set apart from each other at the pixel region, and a resistor device at the resistor region;
   forming a floating diffusion layer between the transfer gate and the reset gate, a light receiving element at a sidewall of the transfer gate away from and opposite to the floating diffusion layer, and a source/drain region at a side of the reset gate away from and opposite to the floating diffusion layer;

sequentially forming a buffer oxide layer, an insulation layer and a mold layer on an entire surface of the substrate;

planarizing the mold layer until the protective insulation layer is exposed;

removing the exposed protective insulation layer and the buffer oxide layer at the pixel region, in series or selectively, to expose the upper surfaces of the gates and to leave exposed the insulation layer on the resistor device; and carrying out a selective silicidation process using a gate metal layer to form gate metal silicide on the exposed gate, wherein the insulation layer has a different etch rate with respect to the mold layer.

11. The method of claim 10, further comprising:

removing the planarized mold layer;

forming a gate spacer at least at a sidewall of the transfer gate adjacent to the floating diffusion layer and at both sidewalls of the reset gate, to expose the floating diffusion layer and the source/drain region;

forming a silicide prevention pattern covering the light receiving element, the floating diffusion layer and the resistor device; and carrying out a selective silicidation process using a source/drain metal layer to form source/drain metal silicide on a surface at the exposed source/drain region, wherein the buffer oxide layer has a slow etch selectivity in comparison with the mold layer.

12. The method of claim 11, wherein the removing the planarized mold layer is carried out before the gate metal silicide is formed.

13. The method of claim 11, wherein the removing the planarized mold layer is carried out after the gate metal silicide is formed.

14. The method of claim 11, wherein the gate metal silicide and the source/drain metal silicide include different metals.

15. The method of claim 11, wherein the forming the gate spacer comprises:

removing the planarized mold layer to conformally form a spacer insulating layer on a substrate having the gate metal silicide; and anisotropically etching the entire surfaces of the spacer insulating layer, the insulation layer and the buffer oxide layer to form the gate spacer at both sidewalls of the transfer gate and at both sidewalls of the reset gate, and a remaining spacer at a sidewall of the resistor device.

16. The method of claim 11, wherein the forming the gate spacer comprises:

removing the planarized mold layer and conformally forming a spacer insulating layer on the substrate having the gate metal silicide; and selectively and anisotropically etching the spacer insulation layer, the insulation layer and the buffer oxide layer to form a buffer oxide pattern, a insulation pattern and a spacer insulation pattern covering the light receiving element and a sidewall of the transfer gate adjacent to the light receiving element, and a remaining spacer at a sidewall of the resistor device.

17. The method of claim 10, wherein the first doped polysilicon layer and the second doped polysilicon layer are formed using different impurity concentrations.

18. The method of claim 10, wherein the gate metal silicide is formed to cover the uppermost surface of the buffer oxide layer formed at sidewalls of the gates.

19. A CMOS image sensor comprising:

a transfer gate and a reset gate disposed on a substrate and set apart from each other;

a gate insulating layer interposed between the gates and the substrate;

a floating diffusion layer disposed between the transfer gate and the reset gate;

a light receiving element disposed at a sidewall of the transfer gate away from and opposite to the floating diffusion layer;

a source/drain region disposed at a sidewall of the reset gate away from and opposite to the floating diffusion layer;

a gate metal silicide disposed at an entire upper surface of the transfer gate and reset gate formed with a selective silicidation process using a gate metal layer;

a silicide prevention pattern covering the light receiving element and the floating diffusion layer; and source/drain metal silicide formed on a surface of the source/drain region and formed with a selective silicidation process using a source/drain metal layer.

20. The CMOS image sensor of claim 19, wherein the gate metal silicide and the source/drain metal silicide include different metals.

21. The CMOS image sensor of claim 19, further comprising a gate spacer formed at both sidewalls of the transfer gate and at both sidewalls of the gate sidewall.

22. The CMOS image sensor of claim 19, further comprising:

a gate spacer formed at the first sidewall of the transfer gate adjacent to the floating diffusion layer and at both sidewalls of the reset gate; and an insulation pattern and a spacer insulation pattern, which are sequentially stacked to cover the light receiving element and the second sidewall of the transfer gate adjacent to the light receiving element, wherein the gate spacer includes a portion formed of the same material as the insulation pattern and a portion formed of the same material as the spacer insulation pattern.

23. The CMOS image sensor of claim 22, further comprising: a buffer oxide pattern interposed between the insulation pattern and the substrate, and the insulation pattern and the second sidewall of the transfer gate, wherein the gate spacer further comprises a portion formed of the same material as the buffer oxide pattern.

24. The CMOS sensor of claim 19, wherein the transfer gate and reset gate comprise a doped polysilicon.

* * * * *